United States Patent
Nystad (10) Patent No.: US 10,230,376 B2
(45) Date of Patent: Mar. 12, 2019

(54) APPARATUS AND METHOD FOR PERFORMING DIVISION

(71) Applicant: ARM LIMITED, Cambridge (GB)

(72) Inventor: Jørn Nystad, Trondheim (NO)

(73) Assignee: ARM Limited, Cambridge (GB)

( * ) Notice: Subject to any disclaimer, the term of this patent is extended or adjusted under 35 U.S.C. 154(b) by 246 days.

(21) Appl. No.: 15/168,436

(22) Filed: May 31, 2016

(65) Prior Publication Data

US 2017/0010862 A1 Jan. 12, 2017

(30) Foreign Application Priority Data

Jul. 10, 2015 (GB) .................... 1512138.7

(51) Int. Cl.
  *G06F 7/535* (2006.01)
  *H03K 19/20* (2006.01)

(52) U.S. Cl.
  CPC ............. *H03K 19/20* (2013.01); *G06F 7/535* (2013.01)

(58) Field of Classification Search
  None
  See application file for complete search history.

(56) References Cited

U.S. PATENT DOCUMENTS

2012/0215939 A1 8/2012 Lu

FOREIGN PATENT DOCUMENTS

GB 1177608 1/1970
GB 2527125 12/2015

OTHER PUBLICATIONS

Combined Search and Examination Report for GB1512138.7, dated Jan. 15, 2016, 5 pages.

*Primary Examiner* — Michael D. Yaary
(74) *Attorney, Agent, or Firm* — Nixon & Vanderhye P.C.

(57) ABSTRACT

An apparatus and method are provided, the apparatus comprising: storage circuitry to store an input data value; divider circuitry to split the input data value into at least one sub-value in dependence on a number of lanes for a current iteration, each sub-value occupying a lane, and to operate on each sub-value to generate a quotient corresponding to the division of that sub-value by a divisor, wherein the divisor is an odd integer; remainder circuitry to operate on each sub-value to generate a remainder corresponding to the remainder of dividing that sub-value by the divisor; concatenation circuitry to concatenate each quotient to produce a concatenated division value, and to concatenate each remainder to produce a concatenated remainder value, in each subsequent iteration, the input data value being formed from the concatenated remainder value of a preceding iteration; and output circuitry to output, after a plurality of iterations, a result of adding the concatenated division values produced by said plurality of iterations.

20 Claims, 10 Drawing Sheets

APPARATUS AND METHOD FOR PERFORMING DIVISION

This application claims priority to GB Patent Application No. 1512138.7 filed 10 Jul. 2015, the entire contents of which is hereby incorporated by reference.

The present technique relates to the field of data processing. In particular, the present technique relates to a method and apparatus for performing division.

It is often desirable to efficiently perform division by a constant integer in a data processing apparatus. This may be especially important in a device such as, for example, a GPU in which such division may be performed repeatedly over a short period of time. However, performing division by some constants can be time consuming. Typically, division may be achieved by either multiplying by a representation of the reciprocal of the divisor or by multiplying by the modulo inverse of the divisor. However, in either case, it may require up to $N^2$ gates in order to implement an apparatus capable of performing such a division, where N represents the number of bits used to represent the number to be divided. Previously proposed improvements may enable the number of gates to be reduced to the order N log(N) for small divisors. However, in an apparatus such as a GPU where the division by a constant may be performed repeatedly, it would be desirable to further improve the efficiency of such divisions.

Viewed from a first example configuration, there is provided an apparatus comprising: storage circuitry to store an input data value; divider circuitry to split the input data value into at least one sub-value in dependence on a number of lanes for a current iteration, each sub-value occupying a lane, and to operate on each sub-value to generate a quotient corresponding to the division of that sub-value by a divisor, wherein the divisor is an odd integer; remainder circuitry to operate on each sub-value to generate a remainder corresponding to the remainder of dividing that sub-value by the divisor; concatenation circuitry to concatenate each quotient to produce a concatenated division value, and to concatenate each remainder to produce a concatenated remainder value, in each subsequent iteration, the input data value being formed from the concatenated remainder value of a preceding iteration; and output circuitry to output, after a plurality of iterations, a result of adding the concatenated division values produced by said plurality of iterations.

Viewed from a second example configuration, there is provided a method comprising the steps: storing an input data value; splitting the input data value into at least one sub-value in dependence on a number of lanes for a current iteration, each sub-value occupying a lane, and to operate on each sub-value to generate a quotient corresponding to the division of that sub-value by a divisor, wherein the divisor is an odd integer; operating on each sub-value to generate a remainder corresponding to the remainder of dividing that sub-value by the divisor; concatenating each quotient to produce a concatenated division value; concatenating each remainder to produce a concatenated remainder value; and outputting, after a plurality of iterations, a result of adding the concatenated division values produced by said plurality of iterations, wherein in each subsequent iteration, the input data value is formed from the concatenated remainder value of a preceding iteration.

Viewed from a third example configuration, there is provided an apparatus comprising: storage means for storing an input data value; divider means for splitting the input data value into at least one sub-value in dependence on a number of lanes for a current iteration, each sub-value occupying a lane, and for operating on each sub-value to generate a quotient corresponding to the division of that sub-value by a divisor, wherein the divisor is an odd integer; remainder means for operating on each sub-value to generate a remainder corresponding to the remainder of dividing that sub-value by the divisor; concatenation means for concatenating each quotient to produce a concatenated division value, and for concatenating each remainder to produce a concatenated remainder value, in each subsequent iteration, the input data value being formed from the concatenated remainder value of a preceding iteration; and output means for outputting, after a plurality of iterations, a result of adding the concatenated division values produced by said plurality of iterations.

The present technique will be described further, by way of example only, with reference to embodiments thereof as illustrated in the accompanying drawings, in which.

Before discussing the embodiments with reference to the accompanying figures, the following description of embodiments is provided.

In accordance with one example configuration there is provided an apparatus comprising: storage circuitry to store an input data value; divider circuitry to split the input data value into at least one sub-value in dependence on a number of lanes for a current iteration, each sub-value occupying a lane, and to operate on each sub-value to generate a quotient corresponding to the division of that sub-value by a divisor, wherein the divisor is an odd integer; remainder circuitry to operate on each sub-value to generate a remainder corresponding to the remainder of dividing that sub-value by the divisor; concatenation circuitry to concatenate each quotient to produce a concatenated division value, and to concatenate each remainder to produce a concatenated remainder value, in each subsequent iteration, the input data value being formed from the concatenated remainder value of a preceding iteration; and output circuitry to output, after a plurality of iterations, a result of adding the concatenated division values produced by said plurality of iterations.

The above apparatus may be used to perform a division by a specific divisor, which is an odd integer (e.g. 3). This value may also be referred to as the constant or the divisor. The storage circuitry stores an input data value, which is the number that is to be divided by the constant. At each iteration, the input data value currently stored in the storage circuitry may be treated as one or more distinct sub-values in dependence upon a number of lanes for the current iteration. The divider circuitry produces, for each sub-value, a quotient that corresponds to the division of that sub-value by the divisor and the remainder circuitry outputs the remainder that would result from such a division. Note that neither the divider circuitry nor the remainder circuitry actually needs to perform the division or remainder operation, as will be discussed later. Accordingly, for each sub-value, both a quotient and remainder are produced. The concatenation circuitry concatenates the quotients in order to produce a concatenated division value. The concatenation circuitry also concatenates the remainders in order to produce a concatenated remainder value. In at least some embodiments, the concatenations include all leading zeros of each quotient/remainder. In subsequent iterations, the input data value is formed from the concatenated remainder value of a preceding iteration. After a plurality of iterations has occurred, the final result is output. This is achieved by adding together all of the concatenated division values from each of the iterations.

Accordingly, a division by a divisor may be split up into a number of sub tasks.

These sub tasks may be performed more efficiently than the original division operation.

In one embodiment, in each subsequent iteration, the number of lanes decreases. Accordingly, the number of sub-values will also decrease in each subsequent iteration, and so the number of quotients and remainders produced will also decrease in each iteration. For example, in each subsequent iteration, adjacent pairs of lanes are merged such that the number of lanes decreases by a factor of 2. In other words, in each subsequent iteration, the number of lanes may halve.

In some embodiments, in each subsequent iteration, the input data value has a bit pattern which constrains each sub-value occupying an associated lane of X bits to one of a limited number of values and thereby constraints the quotient generated from each sub-value; and the limited number of values is less than $2^X$. Since the remainder can only take a limited number of different values, the merging of, for example, two remainders results in a sub-value that can also only take a limited number of values. Consequently, at each iteration the divider circuitry and the remainder circuitry need only consider a limited number of possible inputs. For example, if the divisor is 3, then the remainder of performing a division by 3 can only be 0, 1, or 2. Accordingly, if the remainders in two adjacent lanes are merged together then the result can only be one of nine different values, regardless of the number of bits. Consider for example the merging of two 2-bit remainder values. Since each remainder value can only be 0, 1, or 2, the result of the merge can only be 0, 1, 2, 4, 5, 6, 8, 9, or 10. Similarly, if two 4-bit lanes are merged together, but each 4-bit lane can only represent the number 0, 1, or 2, then the resulting 8 bits are still only used to represent 9 different numbers, even though 8 bits could hypothetically be used to represent 512 different numbers. Hence, the operation performed by the divider circuitry and the remainder circuitry need not actually involve a division but might instead simply examine particular bits in order to output what the result of such a division or remainder operation would be.

Accordingly, the original division by a divisor is split into a number of sub tasks, each involving a division by the divisor. However, because the remainders in one iteration are concatenated together in order to form the input data value of a subsequent iteration, and because the remainders can only have a limited number of possible values, the possible sub-values in each iteration are also limited. Each sub task may therefore be performed more quickly than actually performing a division operation. The original division operation is therefore transformed into a plurality of simpler operations that may be performed more quickly than a previously proposed method of dividing the original input data value by the divisor.

The divider circuitry may take a number of forms. However, in some embodiments, the divider circuitry comprises a lookup table comprising one entry for each of the limited number of values; and the lookup table is indexed using selected bits of a sub-value. A lookup table may enable an output value to be quickly returned, given a particular input value. The time taken to produce the output value may be proportional to the number of possible input values. Accordingly, if the number of possible input values is limited, then a lookup table may provide a very quick way of producing a quotient given a number that is to be divided by the divisor. Since the possible sub-values are limited, the possible remainder values are also limited. Furthermore, the merging together of lanes (via the concatenation of remainder values) means that the possible sub-values in a subsequent iteration will also be limited. Accordingly, it may be possible to index the lookup table using particular selected bits of a sub-value, in particular, those bits that are variable.

In some embodiments, in each subsequent iteration, the input data value has a bit pattern which constrains each sub-value occupying an associated lane of X bits to one of a limited number of values and thereby constraints the remainder generated from each sub-value; and the limited number of values is less than $2^X$.

In some embodiments, the limited number of values is constant across each subsequent iteration. In other words, regardless of the iteration, the number of lanes, or the size of each lane, the number of possible sub-values will always be the same.

In some embodiments the remainder circuitry comprises a plurality of logic gates; and inputs to the logic gates are based on selected bits from a sub-value. Since, in each subsequent iteration, the input data value may only have a limited number of possible values, the number of possible input values to the remainder circuitry is also limited. Accordingly, it may be possible to determine the remainder from such inputs using a plurality of logic gates. In particular, the inputs to the logic gates may be based on selected bits from a sub-value, in particular, those bits that are variable. For example, the remainder circuitry may comprise a plurality of NAND gates. By using a series of logic gates (such as NAND gates) it is possible to efficiently determine the remainder from a division, without having to provide more complicated circuitry to actually perform the division itself.

In some embodiments in each subsequent iteration, the input data value is of a form $a(2^{2(Q+1)}+b$, where a, b, and Q are all integers, Q, a, b≥0, and a and b are each less than the divisor. In other words, in the input data value may be such that it has the bit pattern comprising the concatenation of a (in binary form), followed by zero or an even number (2Q)

of zeros, followed by b (again in binary form). This bit pattern arises from the fact that sub-values are merged at each iteration and the sub-values can only be a limited number of possible values. Consequently, the merged sub-value also only has a limited number of values. The zero or even number of zeros arise from the leading zeros in the second merged remainder value.

In some embodiments, the divisor is 3 or 5. Embodiments in which the divisor is 3 or 5 can be more efficient than embodiments in which the divisor is a higher odd integer, since the number of possible values of remainders and quotients increases as the divisor increases. Consequently, when the divisor is 3 or 5, a small number of possible values for the quotient and the remainder need to be considered, and so the divider circuitry and the remainder circuitry remains small and therefore efficient in terms of both power consumption and processing time.

In some embodiments, the plurality of iterations is of the order log(N), where N corresponds with a number of bits of the input data value.

In some embodiments, the asymptotic complexity of the apparatus is of the order N, where N corresponds with a number of bits of the input data value.

In some embodiments, after the plurality of iterations, there is a single sub-value and the remainder circuitry generates a single remainder from the single sub-value; and the output circuitry is configured to output the single remainder as a final remainder. After the plurality of iterations has occurred, a final remainder value may be produced in addition to the result of adding the concatenated division values. The remainder corresponds with the remainder when dividing the initial input data value by the divisor.

In some embodiments, the input data value is an unsigned integer. However, in some embodiments, the apparatus may contain additional circuitry in order to handle the division of other types such as signed integers or floating point numbers.

In some embodiments, the apparatus further comprises: input adjustment circuitry to perform a first adjustment on a provided data value to store a result of the first adjustment in the storage circuitry as the input data value of a first iteration; and output adjustment circuitry to perform a second adjustment on the result of adding the concatenated division values, wherein the provided data value is a signed integer.

In some of those embodiments, the provided data value is a signed integer in 2s complement form; the first adjustment is to add an offset when the provided data value having L bits is negative; a value of the offset is equal to the divisor multiplied by $2^L$; the second adjustment is to add a constant to the result of adding the concatenated division values; and the constant is selected in dependence on whether or not the provided data value is positive and whether or not the remainder generated by the remainder circuitry in a final iteration is equal to zero. Accordingly, it may be possible to carry out an efficient division by a divisor on a signed integer, as well as an unsigned integer. In particular, this involves using the first adjustment circuitry in order to perform a first adjustment in which an offset is added. The result is then provided as the initial input data value, which is used by the divider circuitry and the remainder circuitry as previously discussed. Once the result of adding the concatenated division values is output, a constant is added. The result of adding this constant corresponds to the result of dividing the signed integer value by the divisor.

In some embodiments, the first adjustment is to add an offset when the initial input data value is positive or negative. Accordingly, the first adjustment is made regardless of whether the initial input data value is positive or negative. This may be achieved, for example, by concatenating the values {1, ~S, P} where ~ denotes bit-wise negation, S represents the top bit of P, and P represents the provided data value (which is a signed integer).

In some embodiments, the concatenated division values produced by said plurality of iterations are added together in reverse order compared to the order in which the concatenated division values were produced. This could be performed using, for example, at least one carry-save adder followed by a carry lookahead adder. This ordering of addition results in a repetitive structure, which can be removed via subexpression elimination to ensure that the number of carry-save-adder gates needed is only O(1) for each lane-division result.

In some embodiments, the provided data value is a floating-point number having a significand M, and exponent E; the first adjustment is to concatenate a first bit, S, and a number of zeros, wherein a value of the first bit is 0 if E is 0, and 1 otherwise; the second adjustment is to adjust the concatenated division values in dependence on E to produce an output significand value, to adjust E in dependence on E and the top bit of the concatenated division values to produce an output exponent value, and to combine the output significand value and the output exponent value to produce an output floating point number. Accordingly, the first adjustment compensates for an input value being a floating-point number. The second adjustment similarly compensates the output such that the output corresponds to the result of dividing the initial floating point number by the divisor. In such embodiments, separate operations are performed on the significand and the exponent of the floating-point number. These adjusted values are then recombined at the end in order to form the divided floating point number.

Particular embodiments will now be described with reference to the figures.

Figure 1:
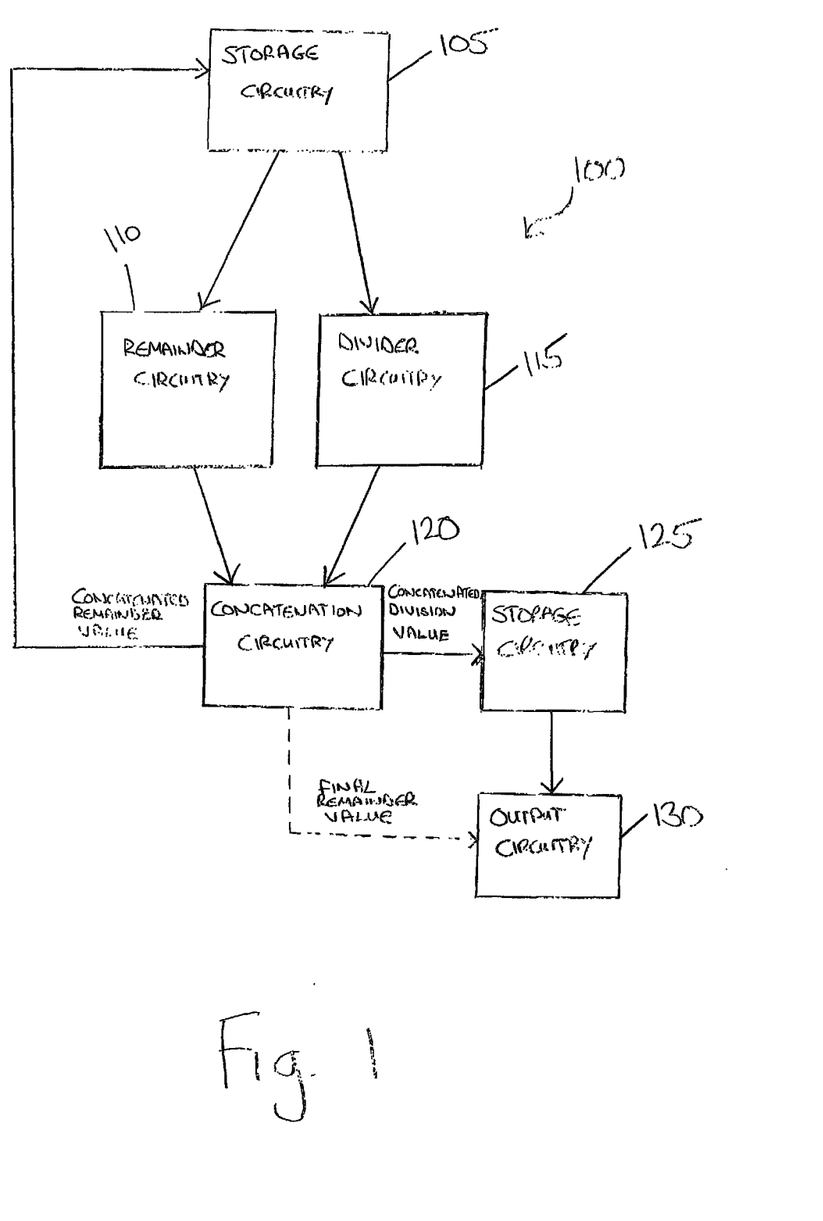
FIG. 1 illustrates, schematically, an apparatus in accordance with one embodiment.

FIG. 1 illustrates an apparatus 100 in accordance with one embodiment. The apparatus 100 comprises storage circuitry 105, which is used to store an input data value. The input data value may be treated as a number of distinct sub-values. The number of sub-values is dependent on a number of lanes in the current iteration. For each of the sub-values, divider circuitry 115 and remainder circuitry 110 provide a quotient and a remainder respectively. The quotient corresponds with the value that would be achieved by the division of the sub-value by the divisor and the remainder corresponds with the remainder that would be obtained after performing such a division. Accordingly, the divider circuitry and the remainder circuitry each produce a value for each sub-value. Concatenation circuitry 120 concatenates the remainder values in order to produce a concatenated remainder value and concatenates the quotient values in order to produce a concatenated division value. The concatenated remainder value is stored in the storage circuitry 105 and this becomes the input data value for a subsequent iteration. The concatenated division value is stored in storage circuitry 125. The number of lanes reduces in each iteration. For example, in this embodiment, pairs of lanes are merged together such that the number of lanes is reduced by half in each iteration. When all of the iterations have been carried out (i.e. when the number of lanes has been reduced to 1), an output circuit 130 outputs the sum of the concatenated division values that have been output by the concatenation circuitry 120 to storage circuitry 125 during each of the previous iterations. The output circuit may also optionally output a final remainder value, which corresponds with the remainder value output by the concatenation circuitry in the final iteration.

The sum of the concatenated division values corresponds with the initial input data value divided by the divisor whilst the final remainder value corresponds with the remainder when performing that division.

The storage circuitry 105 used to store the input data value and the storage circuitry 125 used to store the concatenated division values may be the same storage circuitry or may be different storage circuitry. In each case, examples of storage circuitry include a register, memory, or a cache, and may also include other forms of storage.

When considering the partial-sum values that were stored for "later summation", there will be O(log N) values to add together. This can be done with a series of carry-save adders ending with a carry lookahead adder. Each carry-save-adder has constant delay; they can be connected in series, resulting on O(log N) delay or they can be set up in a Wallace-Tree type reduction structure, resulting in O(log log N) delay. The final carry lookahead adder has O(log N) delay. Given that there are then three stages where none is longer than O(log N), the overall circuit depth is O(log N). At this point, it is noteworthy that the repetitive bit patterns in the division results can be exploited: by using carry-save adders to add the partial sums in reverse order: with the last layers added first and the first layers added last. This ordering of the addition results in a repetitive structure, where many partial results are computed identically in many bit positions; this can be removed by common subexpression elimination, to ensure that the number of carry-save-adder gates needed is only O(1) (about 10-15 gates or so) for each lane-division result. Given that there are O(N) lane divisions, it means that the circuit as whole can be implemented in O(N) size.

Typically the circuitry is configured to operate for a single divisor. For example, in some embodiments, the apparatus 100 may be such that the divisor is 3. In other embodiments, the apparatus 100 may be such that the divisor is 5.

Figure 2:
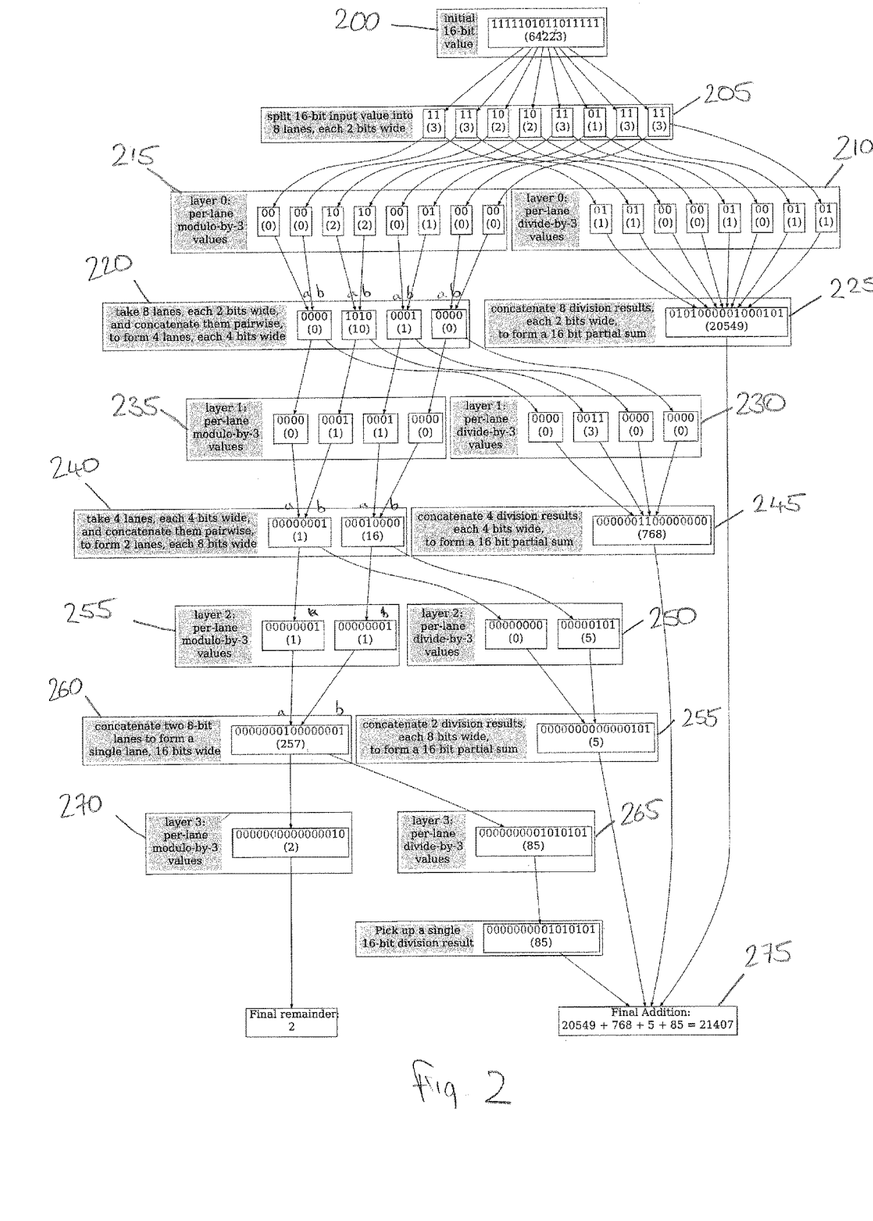
FIG. 2 illustrates a worked example when employing the technique of one embodiment, in which the integer 64223 is divided by the divisor 3 in order to produce the result 21407 with remainder 2.

FIG. 2 illustrates a worked example of dividing the number 64223 by 3. The result of the process is 21470 with a remainder of 2.

At a node 200, the initial input data value (64223) is provided. This input data value is treated as 8 distinct sub-values as shown in node 205, which corresponds with 8 lanes, each 2 bit wide. At a node 210, a quotient is produced for each of the 8 sub-values. The quotient corresponds with the value that would be obtained by dividing the sub-value by 3 (which in this example is the divisor). Similarly, at a node 215 the remainder from such a division is provided for each of the 8 sub-values in the 8 lanes. This process may be carried out by divider circuitry 115 and remainder circuitry 110 respectively. At a node 220, the set of remainder values is concatenated. The result is then provided as the input data value for a subsequent iteration. In the subsequent iteration, the number of lanes is reduced to 4. Accordingly, each lane has 4 bits. It may be noted that this is the equivalent of performing a pair-wise merging on each pair of remainder values. Similarly, at node 225 the set of quotients is concatenated together in order to form a concatenated division value. This value is stored in memory. However, as illustrated in FIG. 2, this value will be used at the end of the process in a final addition operation. At node 230, each of the now 4 sub-values is used to produce a quotient. Again, the quotient corresponds with the result of dividing the sub-value by the divisor 3. Similarly at node 235, the remainder of such a division is produced. At node 240, the previous iteration's remainder values are concatenated together to form the input data value for a subsequent iteration. This is equivalent to performing a pair-wise merging on pairs of remainder values. Accordingly, the number of lane is halved once again, resulting in two lanes each of 8-bit width.

It should be noted at this point, that since the remainder value when dividing by 3 can only be 0, 1 or 2, there are a limited number of values that the merging of two remainder values can achieve. In particular, only the lower two bits of each of the remainder values in a previous iteration can be non-zero. Accordingly, when the values are merged, there are only four bits in the result that can be non-zero. These are shown in bold in the example of FIG. 2. The remaining bits in the sub-values are always 0. This is significant because it means that only a limited number of possible inputs exist when the quotient and the remainder are to be determined. Accordingly, it is not necessary to perform an actual division or remainder operation. Instead, it may be possible to only examine the (in this case) 4 bits and thereby determine what the result of a division or a remainder operation would be without actually performing the division or remainder operation itself. Again, at node 245, the quotients are merged together in order to form a concatenated division value, which will be used in an addition operation later. Once more, at node 250, the sub-values are used in order to determine quotients, which correspond to the results that would be achieved by dividing the sub-values by the divisor 3. Similarly node 255 involves the creation of the remainder value from such a division. Again, it is noted that since only a small number of bits in the sub-value can be non-zero, it may be possible to determine both the division result and the remainder result by analysis of these bits alone. In particular, it is unnecessary for a full division or remainder operation to be carried out. The quotients are concatenated together at node 255 to form a further concatenated division value which is stored for later use. The remainder values are concatenated together at node 260 in order to form a single lane of 16-bit width. Finally, at node 265, a quotient is determined for this single sub-value and at node 270, the remainder for the sub-value is determined. The final division result is then added to each of the previous concatenated division values at node 275 in order to form a final division value. Similarly, the final remainder value produced from node 270 is produced as the final remainder of dividing the initial input data value by the divisor. Accordingly, the final result is achieved by adding together the concatenated division values 20549+268+5+85 to give a final value of 21407 and a remainder of 2.

In the first iteration, there are a very limited number of possible values for each sub-value. In the embodiment shown in FIG. 2, in which the divisor is 3, each lane is initially 2-bit and therefore there are only four possible sub-values. Furthermore, if a sub-value is 0, 1, or 2 then the remainder is the same as the input value, whereas if the sub-value is 3, then the remainder is 0. Similarly, if the sub-value is 0, 1, or 2 then the quotient is 0 and if the sub-value is 3 then the quotient is 1. Hence, it can be seen that in the initial iteration, it is only necessary, in this embodiment, to consider whether both bits of the sub-value are 1 or not and so the result of performing a division or remainder operation can be determined without actually performing the division or remainder operation.

The above example assumes that the divide by 3 circuit has a power of 2 width. For widths that are not a power of 2, the input can be zero-extended to the next power of 2 and the Final Addition result can be truncated to the desired width. Other ways to handle inputs that do not have a power of two include splitting the input into variable-size lanes (e.g. 1-bit lanes or 3-bit lanes). For example, for a 12-bit input, the input may be split into three 2-bit lines and two 3-bit lanes. Alternatively, in some iterations, only some lane pairs may be merged. For example, for a 12-bit input, the input may initially be split into 6 lanes. When lane merging is to occur, only two pairs of lanes may be merged together even though it is theoretically possible to merge three pairs. The result of this will be four (a power of two) merged lanes, rather than three. Since the number of iterations is unchanged, latency is unaffected.

Although, in this embodiment, pairs of lanes are combined, in other embodiments, other numbers of lanes may be combined. For example, three adjacent lanes may be combined rather than two. This may reduce the number of iterations at the cost of increasing the complexity of the circuitry used—in particular, by merging more lanes together, the number of possible values for each subvalue may be increased, resulting in a need for more complex circuitry for determining the quotient and/or the remainder.

Figure 3:
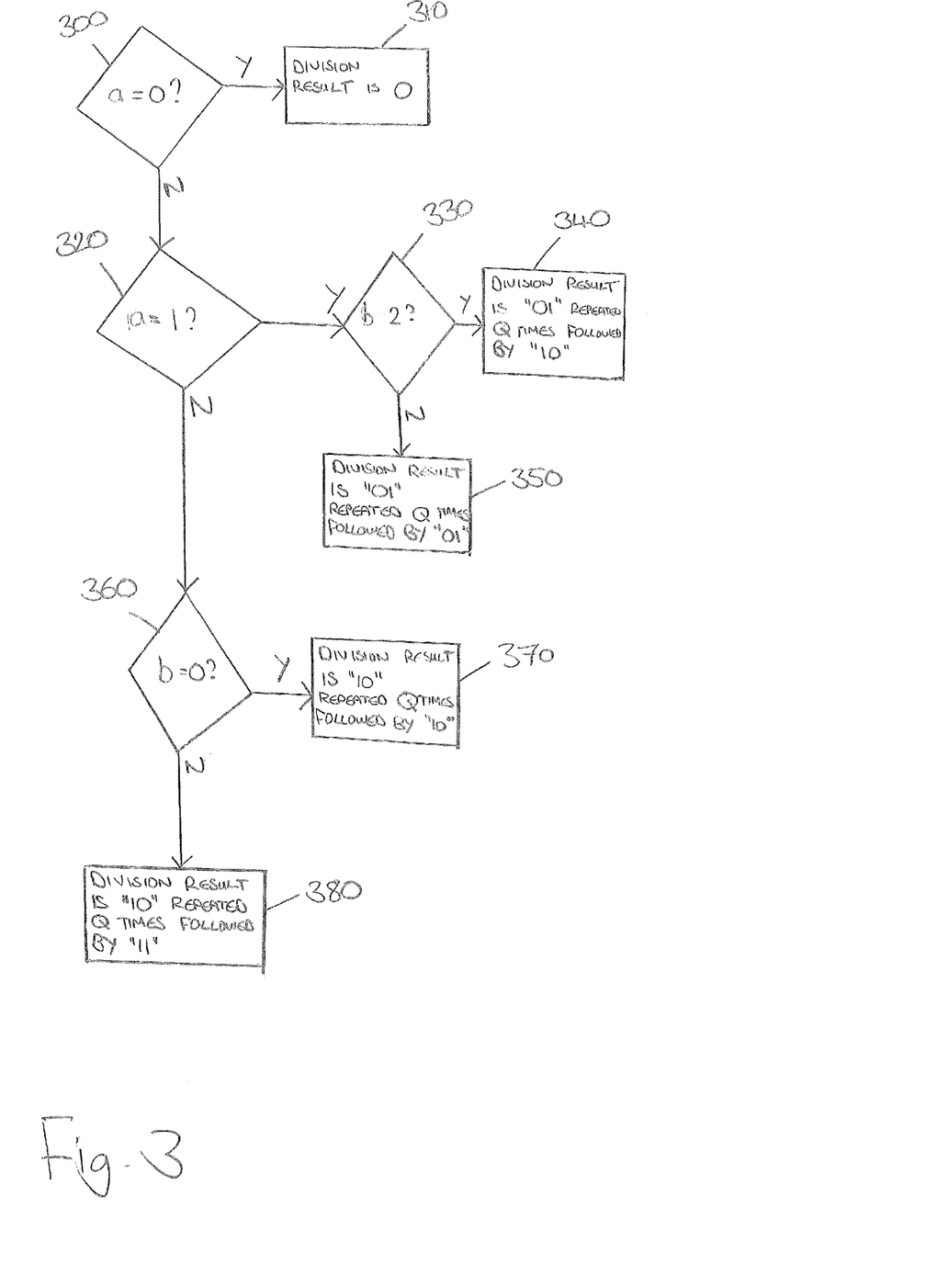
FIG. 3 illustrates a flow chart that shows the operation of divider circuitry of the apparatus in accordance with one embodiment.

In subsequent iterations (i.e. iterations other than the first iteration), it is still not actually necessary to perform the division operation, since only a small number of bits of each sub-value will vary. Accordingly, it may be possible to determine the result of the division without actually performing the division operation itself. It may therefore be possible to determine the division result very efficiently. FIG. 3 illustrates a flow chart indicating how such a determination may be made. The process assumes that the input value will always have the form: $a(2^{2(Q+1)})+b$, where a, b and Q are all integers and a, b and Q are all greater than or equal to 0, and a and b are each less than the divisor. This example considers the case where the divisor is 3. In other words, in this embodiment, the bit pattern will comprise two bits (representing a), followed by 2Q zeros, followed by a further two bits (representing b).

The process begins at a step 300, where it is determined whether or not a is equal to 0. If so, then at step 310 the result of the division is 0. This corresponds with a case where the input data value is 0, 1 or 2, in which case the result is clearly 0. If not, then at step 320, it is determined whether or not a is 1. If so, then at step 330 it is determined whether b is 2. If so, then the division result is equal to "01" repeated Q times followed by "10". If the result at step 330 is false, then the division result is "01" repeated Q times followed by "01". If at step 320, a is not equal to 1, then at step 360, it is determined whether or not b is 0. If so, then at step 370, the division result is "10" repeated Q times, followed by "10". Otherwise, at step 380, the division result is "10" repeated Q times, followed by "11". Accordingly, it can be seen that the division result can be determined by an analysis of only a small number of bits as a consequence of the input value being restricted to a limited number of inputs. In this case, with the divisor being 3, it is possible to determine the division result by an analysis of merely four bits. This is true regardless of the input data value size.

Figure 4:
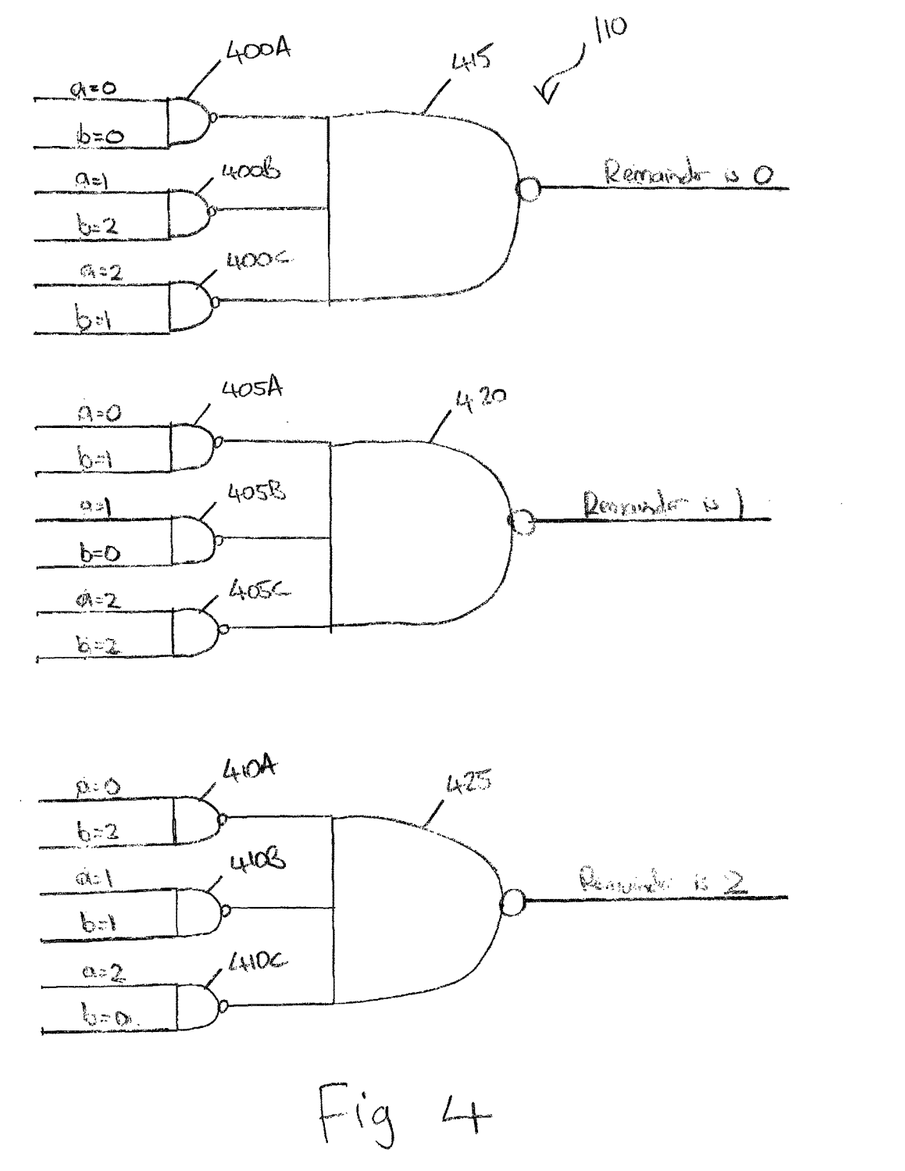
FIG. 4 illustrates a series of logic gates that may be used to implement remainder circuitry of the apparatus in accordance with one embodiment.

A similar observation may be made in respect of the remainder value. FIG. 4 illustrates circuitry which may be used in order to determine the remainder value in dependence on the analysis of only a small number of bits of the input data value. In particular, the bits being analysed are those that may vary in the sub-value. The circuitry in FIG. 4 is made up of a plurality of primary NAND gates 400a to 400c, 405a to 405c, 410a to 410c. Each of the NAND gates receives a pair of signals, either of which may be high or low. For example, considering the NAND gate 400a, the first signal would be high if a is 0 and would be low otherwise, whilst the other signal would be high if b is 0, and would be low otherwise. The NAND gates perform a NAND function. This is equivalent to performing a boolean AND function and negating the result. A boolean AND function returns a high result if both of the inputs are high and otherwise returns a low result. The outputs from each trio of primary NAND gates is then provided to a secondary NAND gate 415, 420, 425. These NAND gates perform a similar function, but receive 3 inputs. Accordingly, they negate the result of an AND gate that receives 3 inputs, which returns a high value if all of the inputs are high, and otherwise returns a low value. If the output of NAND gate 415 is high, this corresponds to the remainder being 0. If the output of NAND gate 420 is high, then this corresponds to the remainder being a value 1, and if the NAND gate 425 returns a high result, then this corresponds with the remainder being 2. The secondary NAND gates are arranged in such a manner that the outputs are mutually exclusive, in other words, only one of the secondary NAND gates 415, 420, 425 may be high at any one time. Accordingly, it can be seen how this circuitry can be used in order to determine the remainder value without actually performing a remainder or division operation. In particular, by analysing a small number of bits of the sub-value, which correspond to bits that may vary, it is possible to efficiently determine what the remainder value is.

Figure 5:
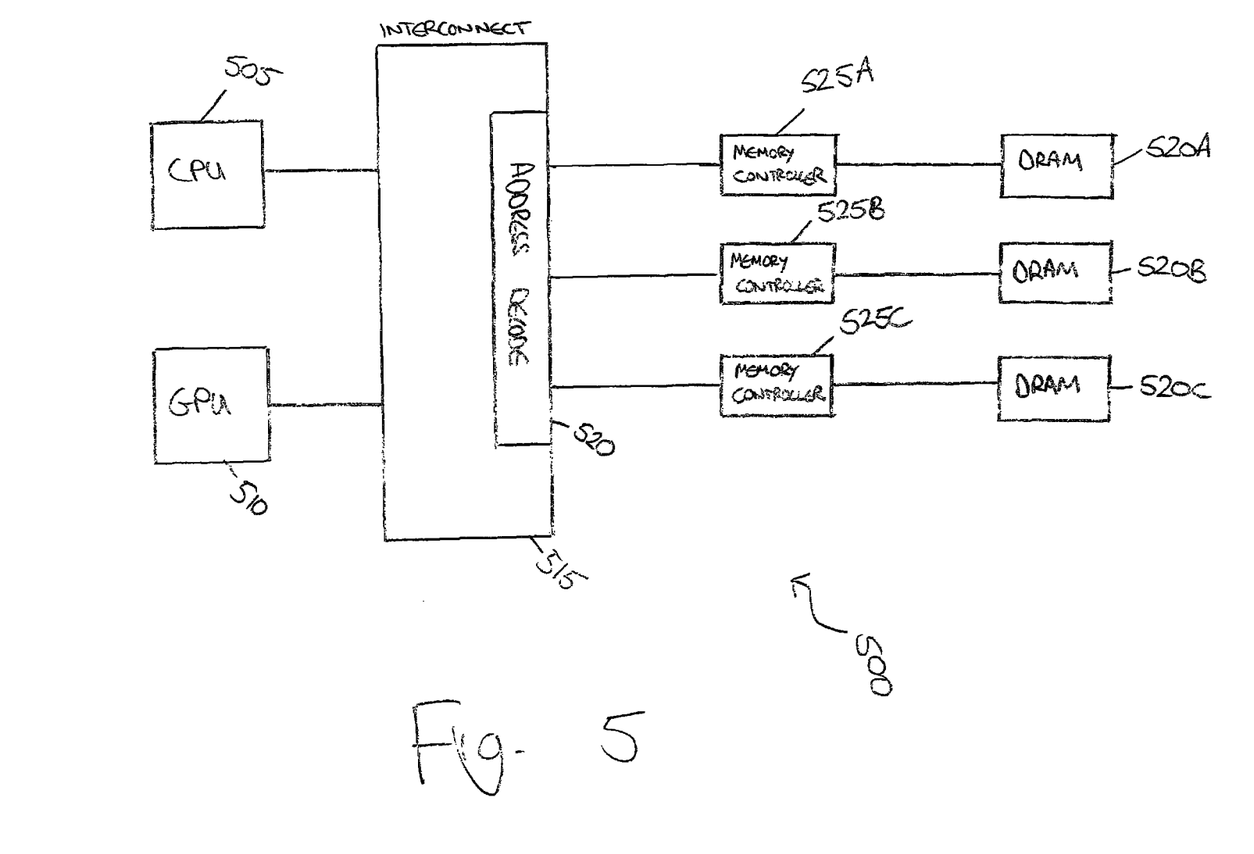
FIG. 5 illustrates a system comprising a number of components, each of which may make use of the present techniques.

FIG. 5 illustrates a system 500 comprising a number of different components that may make use of the present technique for efficiently dividing by an odd integer. The system comprises a CPU 505 and a GPU 510 each connected to an interconnect 515. The interconnect 515 comprises address decode circuitry 520, which is used to address memory 520a, 520b, 520c arranged into three different banks of memory. Each of the banks of memory 520a, 520b, 520c is accessed via a corresponding memory controller 525a, 525b, 525c.

A CPU may use the previously mentioned technique in order to achieve a more efficient division by a divisor such as 3. This may form part of, for example, an arithmetic logic unit (ALU). Note that a division by a larger number may involve the division by a smaller number. For example, a division by 6 may involve a division by 2 followed by a division by 3. Accordingly, the particular techniques described herein for achieving efficient division by an odd integer divisor may be used as a consequence of pattern matching a dividend at instruction execution time.

Alternatively, a specialised divide instruction may be implemented for efficient division by the divisor (such as 3).

Division by 3 can be relatively common in a GPU 510. For example, ASTC texture addressing may be implemented using a division-by-3 to determine an index and or offset for particular blocks of pixels in a texture map that has been compressed using ASTC. Division by 3 also occurs when processing cubemaps. A cubemap may represent a local 3D environment as projected on a cube. A cubemap may therefore represent 6 square textures, which represent the faces of the cube. However, a cubemap itself may not define what colour the pixels in corners of the cube should be.

One way to resolve this problem is to average the colour values of the nearest pixel in each of the 3 adjoining faces. Accordingly, this process will require a division by 3 and where this process occurs frequently or repeatedly, it may be beneficial for the division by 3 to occur efficiently.

A further example of where this technique may be used may be in, for example, a memory sub system. In a system such as that shown in FIG. 5, data striping may be carried out. This is a process in which sequential data is distributed across multiple storage devices. This technique can be used in order to inhibit data loss. Should one of the storage devices fail, it may be possible to retrieve the lost data based on the data stored in the other storage devices. Furthermore, this technique may be used in order to improve throughput. In particular, if one storage device cannot process data more quickly than it is being provided, then by spreading the data across a plurality of storage devices, the throughput may be improved. A natural way to perform striping would be to take an incoming address to the storage device and to divide by the number of storage devices in order to obtain an address that is sent to a specific storage device. The remainder of the division may then be used in order to determine which of the storage devices is to be accessed. In the embodiment shown in FIG. 5, when the interconnect 515 receives a particular incoming address, this may be divided by 3 in order to work out a replacement address. The remainder value from the division by 3 may then indicate which of the memory devices 520a, 520b, 520c is to be accessed at the calculated address. The result for the calculated address may then be sent to the relevant memory bank via the associated memory controller 525a, 525b, 525c.

Accordingly it can be seen there are a number of situations in which the present technique may be used in order to efficiently divide by an odd integer such as 3 and this may result in a more efficient (better) data processing system.

Figure 6:
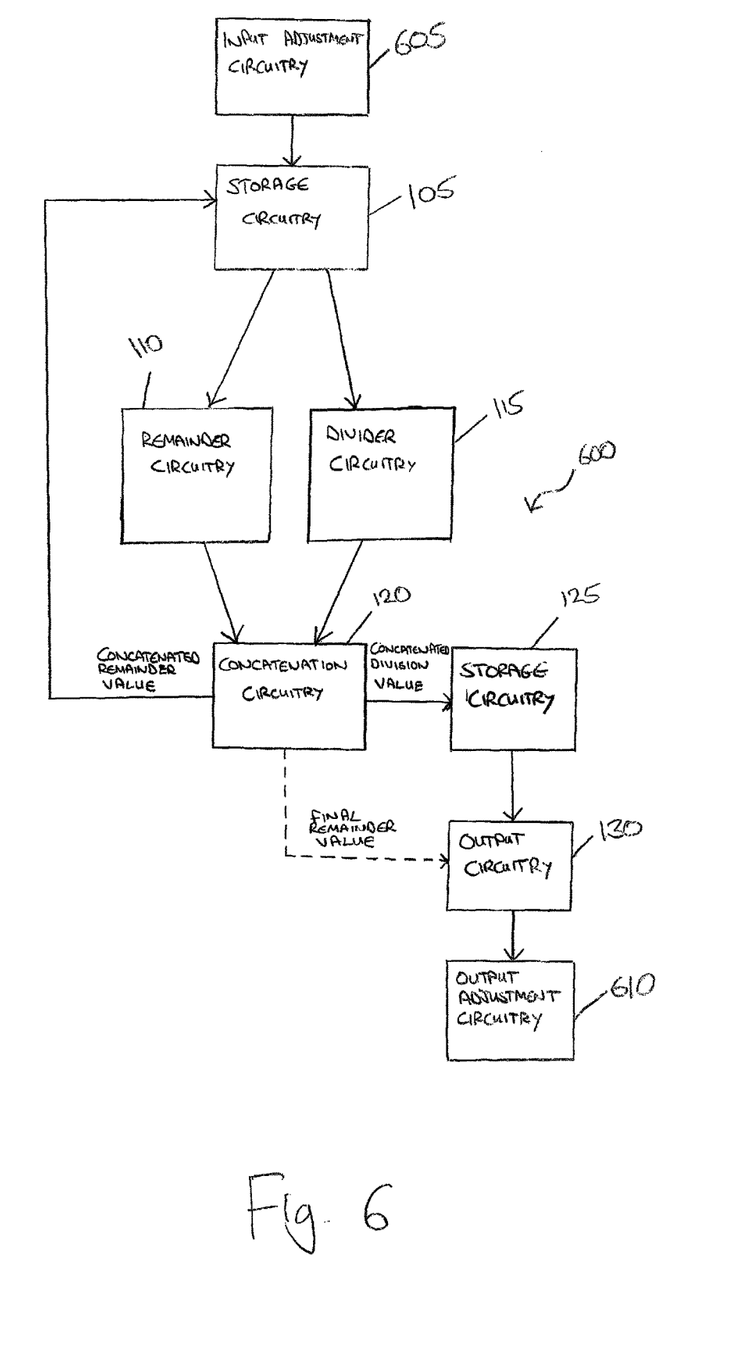
FIG. 6 illustrates, schematically, an example of an apparatus in accordance with one embodiment.

FIG. 6 shows an embodiment in which the system 600 has additional input adjustment circuitry 605 and output adjustment circuitry 610. Such an embodiment can be used in order to handle the input of signed integers, as well as floating point numbers. The input adjustment circuitry 605 receives the input value and performs additional adjustments to this value, before passing it to the storage circuitry 105. Similarly, the value output by the output circuit 130 is provided to the output adjustment circuitry 610, which performs final adjustments to the output value. Depending on the input and output adjustments, the circuitry may be used in order to handle the division of a signed integer or a floating point number and appropriate adjustments to be made by the input adjustment circuitry 605 and output adjustment circuitry 610 for each of these different input types will be discussed below.

Figure 7:
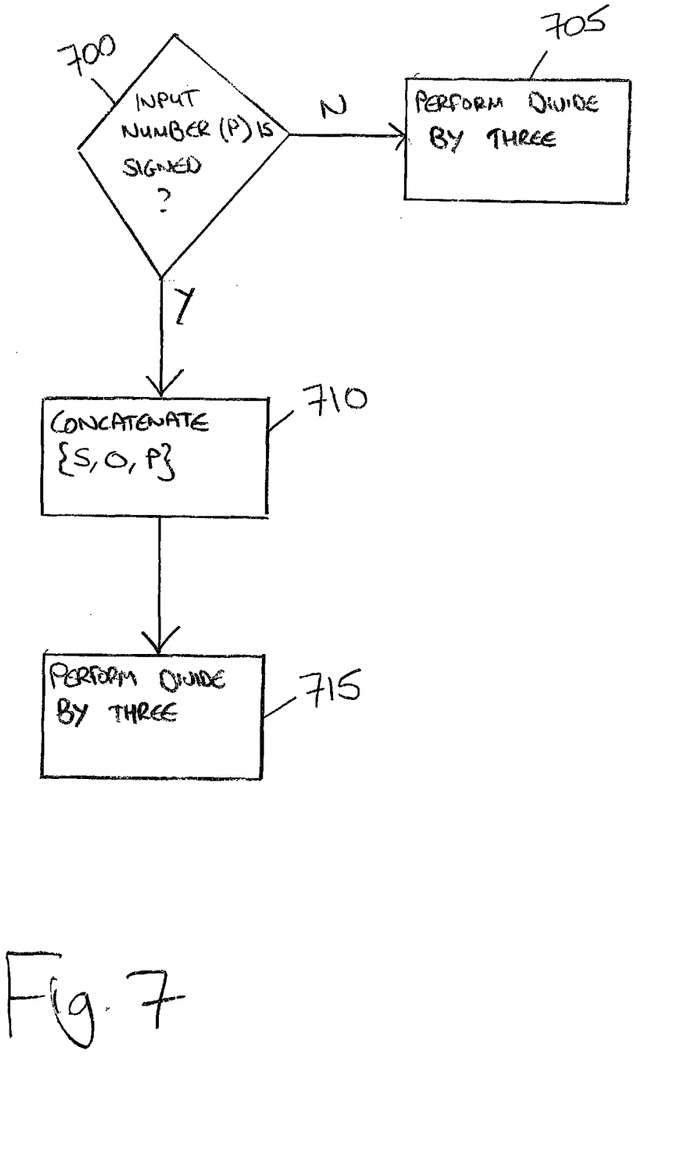
FIG. 7 shows a flow chart illustrating the behaviour of input adjustment circuitry for handling the division of a signed integer by a constant in accordance with one embodiment.

FIG. 7 illustrates, in flow chart form, an input adjustment that may be made by the input adjustment circuitry 605 in order to handle the division by 3 (in this example) of a signed integer (P). At step 700, it is determined whether or not the value input to the input adjustment circuitry 605 is a signed integer or not. If not, then the division by 3 process proceeds as previously explained in step 705. If so, at step 710, a concatenation is performed, for an input number (P) having a first bit S (i.e. the sign bit) the concatenation comprises the bit S followed by a bit 0 followed by the input number P (in binary form). The concatenation result is then divided by 3 as previously explained in step 715. The effect of performing the concatenation is to add an offset of $3*2^L$ to negative numbers (where L is the number of bits in the signed input number P). As a consequence of dividing this by 3, the offset is reduced to $2^L$.

Alternatively, it's possible to construct the input data number as {1, ~S, P}, where ~ denotes bitwise negation; this produces the same result but may be slightly more efficient depending in circumstances. (The effect is that of adding an offset of $3*2^N$ to all inputs, whether positive or negative.)

Figure 8:
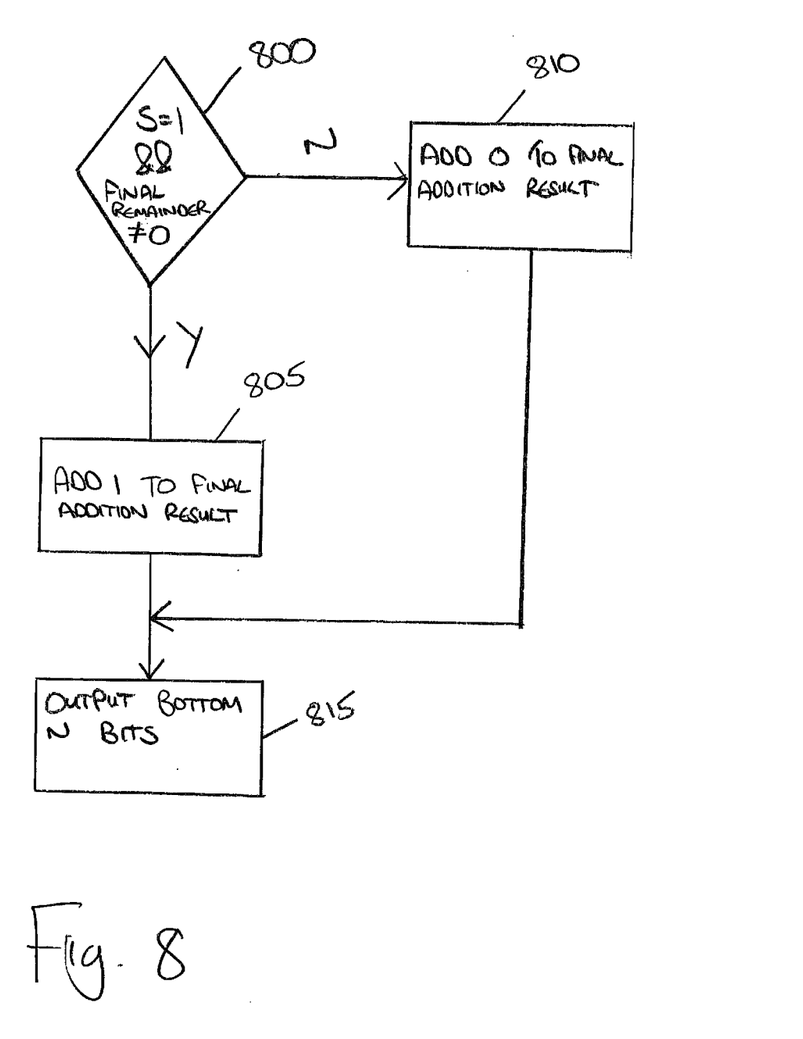
FIG. 8 shows a flow chart illustrating the behaviour of output adjustment circuitry for handling the division of a signed integer by a constant with accordance with one embodiment.

FIG. 8 shows the corresponding adjustment made by the output adjustment circuitry 610 in order to deal with input numbers where the input is a signed integer. At step 800, it is determined whether or not S is equal to 1 and whether the final remainder value is not equal to 0. If these conditions hold, then at step 805, the final addition result produced by the output circuitry 130 is incremented by 1. Otherwise, the final addition result is incremented by 0. In either case, the bottom L bits are output at step 815 (L is the number of bits of the signed input number P).

Figure 9:
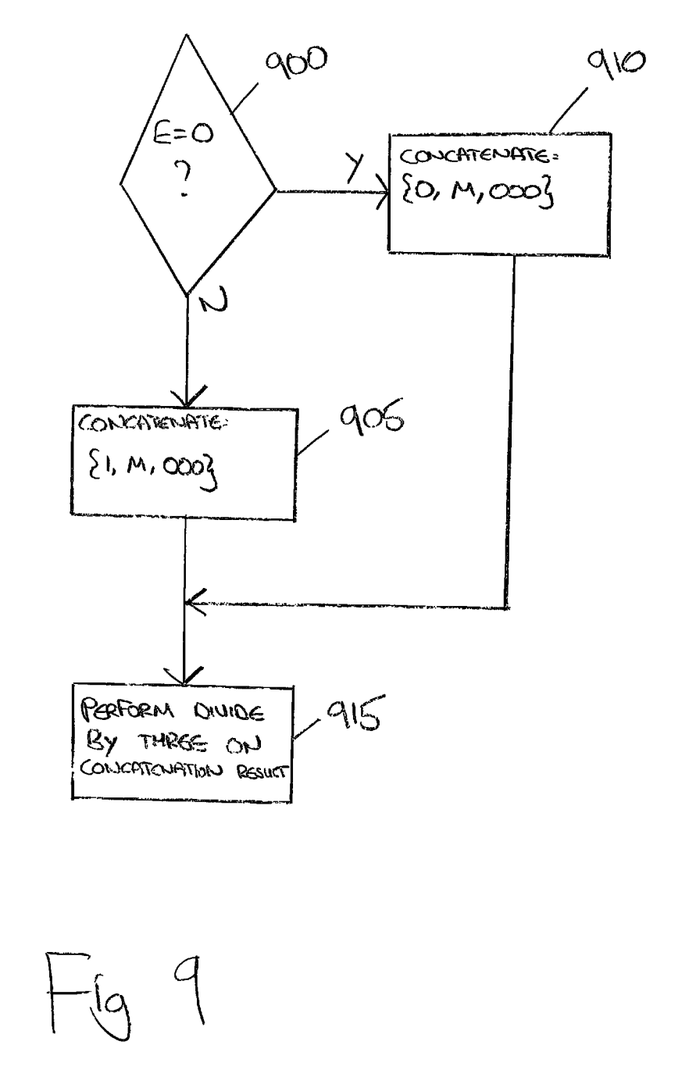
FIG. 9 shows a flow chart illustrating the behaviour of input adjustment circuitry for handling the division of a floating point number by a constant in accordance with one embodiment.

FIG. 9 considers an adjustment that may be made by the input adjustment circuitry 605 in order to deal with a division by 3 (in this embodiment) on floating point numbers. This process considers an adjustment where the input value is provided using the representation defined by the IEEE 754 Standard. This Standard represents a floating point number as a sign (S), an exponent (E) and a mantissa or significand (M). For a particular representation, a certain number of bits (B) will be used to represent the significand. For example, IEEE 754 defines this as being 24 for a single precision (32-bit) floating point number.

In this embodiment, the significant and the exponent are handled separately.

The process begins at step 900 where it is determined whether or not E is equal to 0. If this is the case, then at step 910 a concatenation is performed. Concatenation comprises combining a 0 followed by the bits representing S followed by three further 0s. Alternatively, if E is not equal to 0, then at step 905, a different concatenation is performed. This consists of combining a 1 followed by the bits representing S followed by three further 0s. In either event, at step 915, the division by 3 is carried out, as previously discussed, on the result of the concatenation.

Figure 10:
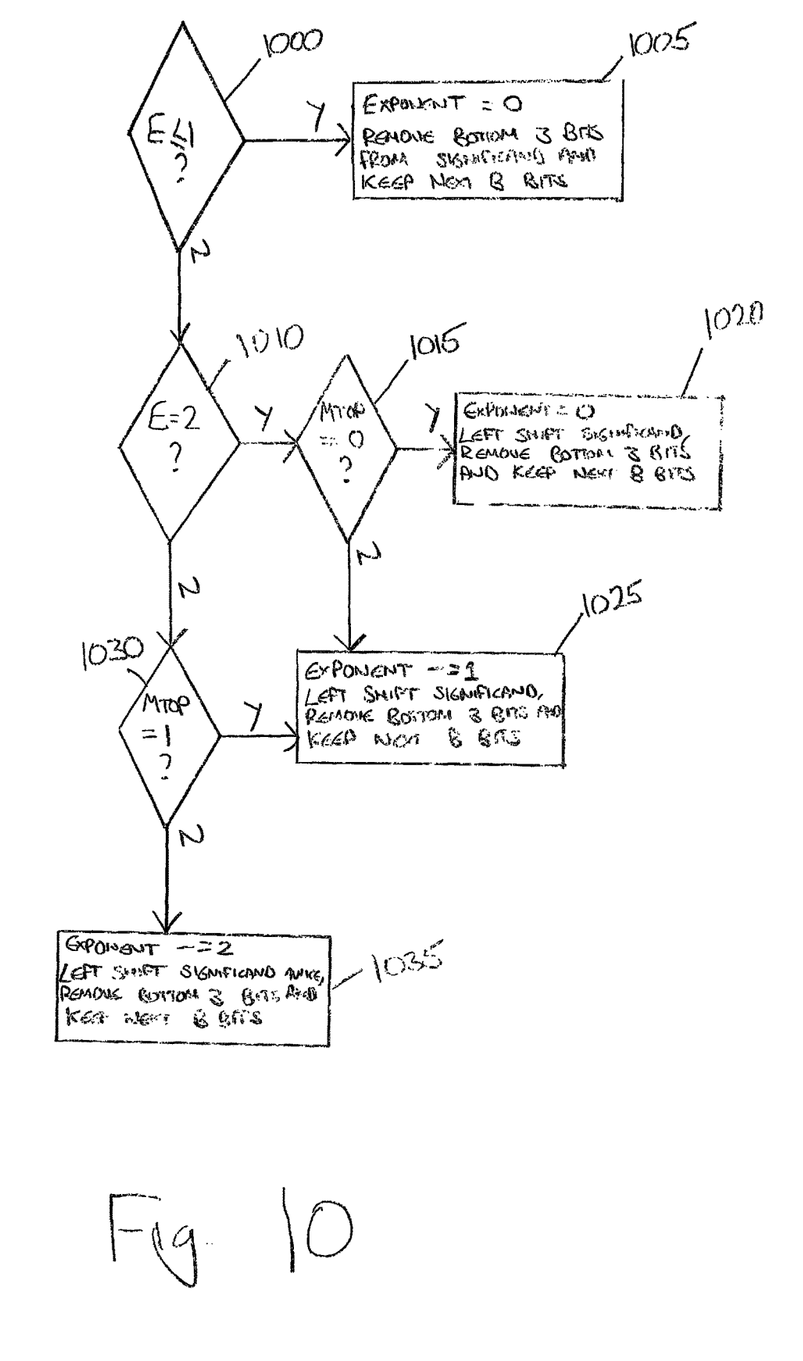
FIG. 10 shows a flow chart illustrating the behaviour of output adjustment circuitry for handling the division of a floating point number by a constant in accordance with one embodiment.

FIG. 10 illustrates the output adjustments that may be performed, for example, output adjustment circuitry 610 in order to handle division of a floating point number. In each case, the final floating point number that is output is dependent on both an exponent and a significand. The significand is based on the final division result from the output circuitry 130. At step 1000, it is determined whether or not E is less than or equal to 1. If so, then at step 1005 the result is output such that the output exponent is equal to 0 and the output significand is equal to the top B bits of the final division result. Alternatively, if at step 1000, E is greater than 1, then at step 1010 it is determined whether or not E is equal to 2. If so, then at step 1015, it is determined whether or not MTOP (the top bit of the significand) is equal to 0. If so, then at step 1020, the result has an output exponent of 0 and an output significand equal to the top B bits of the final division result shifted once to the left. If at step 1015 it is determined that MTOP is not equal to 0, then at step 1025 the result is output such that the output exponent is equal to E−1 and the output significand is equal to the top B bits of the final division result shifted once to the left. If at step 1010, E is not equal to 2, then the flow proceeds to step 1030. If at step 1030 MTOP is equal to 1 then the flow proceeds to step 1025 as already discussed. Alternatively, if MTOP is not equal to 1 at step 1030 then the result has an output exponent of E−2 and the output significand is equal to the top B bits of the final division result shifted twice to the left.

This produces a correct round-to-zero result. To get a round-to-nearest result, add a rounding constant C as an extra input to the addition carried out by the output circuitry 130. This rounding constant must be picked to add a contribution of 0.5 ulps (unit of least precision) to the final result, producing the following possible cases:

Zero-bit left-shift: C=4
One-bit left-shift: C=2
Two-bit left-shift: C=1

The "left-shift" in these cases relates to the amount that the final division result has been left shifted (if any) in any of steps 1005, 1020, 1025, or 1030.

For the divide by 3 operation, it is not possible to hit a floating-point midpoint value (a value that is exactly midway between two representable values). As such, there is no distinction between round-to-nearest-even and round-to-nearest-away. Rounding can cause the result to tip over from one exponent value to another in one case: when E=2 and Mtop=0 (at step 1020) and all other significand bits are 1, rounding will tip the result over from largest-representable-denormal to smallest-representable-normal, in which case the output exponent will be 1 and the output significand will be 0. This requires a gate to turn the least significant bit of the exponent from 0 to 1 for this particular case; no special-case handling is needed for the significand.

As such, the floating-point support, in addition to the actual divide by 3 circuit, also adds a 3-way multiplexer and a little extra logic for the rounding constant and the exponent handling logic. Handling of IEEE's Infinity/NaN values can be done by detecting the case where E has an all-1s bit-pattern, and adding a fourth way to the aforementioned multiplexer for copying input to output in order to handle this case.

In many of the aforementioned embodiments, a division by 3 has been referred to. However, it will be appreciated by the skilled person that a similar process may be extended to any odd integer. In particular, the previously described technique may have particular benefit when used in order to achieve a division by 5 or 7.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

I claim:

1. An apparatus comprising:
storage circuitry to store an input data value;
divider circuitry to split the input data value into at least one sub-value in dependence on a number of lanes for a current iteration, each sub-value occupying a lane, and to operate on each sub-value to generate a quotient corresponding to the division of that sub-value by a divisor, wherein the divisor is an odd integer;
remainder circuitry to operate on each sub-value to generate a remainder corresponding to the remainder of dividing that sub-value by the divisor;
concatenation circuitry to concatenate each quotient to produce a concatenated division value, and to concatenate each remainder to produce a concatenated remainder value, in each subsequent iteration, the input data value being formed from the concatenated remainder value of a preceding iteration; and
output circuitry to output, after a plurality of iterations, a result of adding the concatenated division values produced by said plurality of iterations.

2. An apparatus according to claim 1, wherein
in each subsequent iteration, the number of lanes decreases.

3. An apparatus according to claim 2, wherein
in each subsequent iteration, adjacent pairs of lanes are merged such that the number of lanes decreases by a factor of 2.

4. An apparatus according to claim 1, wherein
in each subsequent iteration, the input data value has a bit pattern which constrains each sub-value occupying an associated lane of X bits to one of a limited number of values and thereby constraints the quotient generated from each sub-value; and
the limited number of values is less than 2X.

5. An apparatus according to claim 4, wherein
the divider circuitry comprises a lookup table comprising one entry for each of the limited number of values; and
the lookup table is indexed using selected bits of a sub-value.

6. An apparatus according to claim 1, wherein
in each subsequent iteration, the input data value has a bit pattern which constrains each sub-value occupying an associated lane of X bits to one of a limited number of values and thereby constraints the remainder generated from each sub-value; and
the limited number of values is less than 2X.

7. An apparatus according to claim 4, wherein
the limited number of values is constant across each subsequent iteration.

8. An apparatus according to claim 1, wherein
the remainder circuitry comprises a plurality of logic gates; and
inputs to the logic gates are based on selected bits from a sub-value.

9. An apparatus according to claim 8, wherein
the remainder circuitry comprises a plurality of NAND gates.

10. An apparatus according to claim 1, wherein
in each subsequent iteration, the input data value is of a form a(22(Q+1))+b, where a, b, and Q are all integers, Q, a, b≥0, and a and b are each less than the divisor.

11. An apparatus according to claim 1, wherein
the divisor is 3 or 5.

12. An apparatus according to claim 1, wherein
the plurality of iterations is of the order log(N), where N corresponds with a number of bits of the input data value.

13. An apparatus according to claim 1, wherein
the asymptotic complexity of the apparatus is of the order N, where N corresponds with a number of bits of the input data value.

14. An apparatus according to claim 1, wherein
after the plurality of iterations, there is a single sub-value and the remainder circuitry generates a single remainder from the single sub-value; and
the output circuitry is configured to output the single remainder as a final remainder.

15. An apparatus according to claim 1, wherein
the input data value is an unsigned integer.

16. An apparatus according to claim 1, the apparatus further comprising:
input adjustment circuitry to perform a first adjustment on a provided data value to store a result of the first adjustment in the storage circuitry as the input data value of a first iteration; and output adjustment circuitry to perform a second adjustment on the result of adding the concatenated division values.

17. An apparatus according to claim 16, wherein the provided data value is a signed integer in 2s complement form;

the first adjustment is to add an offset when the provided data value having L bits is negative;

a value of the offset is equal to the divisor multiplied by $2^L$;

the second adjustment is to add a constant to the result of adding the concatenated division values; and the constant is selected in dependence on whether or not the provided data value is positive and whether or not the remainder generated by the remainder circuitry in a final iteration is equal to zero.

18. An apparatus according to claim 17, wherein the first adjustment is to add an offset when the initial input data value is positive or negative.

19. An apparatus according to claim 16, wherein the provided data value is a floating-point number having a significand M, and exponent E;

the first adjustment is to concatenate a first bit, S, and a number of zeros, wherein a value of the first bit is 0 if E is 0, and 1 otherwise;

the second adjustment is to adjust the concatenated division values in dependence on E to produce an output significand value, to adjust E in dependence on E and the top bit of the concatenated division values to produce an output exponent value, and to combine the output significand value and the output exponent value to produce an output floating point number.

20. An apparatus according to claim 1, wherein the concatenated division values produced by said plurality of iterations are added together in reverse order compared to the order in which the concatenated division values were produced.

* * * * *